United States Patent
Ha

(10) Patent No.: US 7,489,520 B2
(45) Date of Patent: Feb. 10, 2009

(54) PRINTED CIRCUIT BOARD AND LIQUID CRYSTAL DISPLAY DEVICE HAVING THE SAME

(75) Inventor: Young Soo Ha, Gumi-shi (KR)

(73) Assignee: LG Display Co., Ltd., Seoul (KR)

( * ) Notice: Subject to any disclaimer, the term of this patent is extended or adjusted under 35 U.S.C. 154(b) by 161 days.

(21) Appl. No.: 11/023,366

(22) Filed: Dec. 29, 2004

(65) Prior Publication Data

US 2005/0243530 A1 Nov. 3, 2005

(30) Foreign Application Priority Data

Apr. 29, 2004 (KR) ........................ 10-2004-0030205

(51) Int. Cl.
*H05K 7/02* (2006.01)
*H05K 7/06* (2006.01)
*H05K 7/08* (2006.01)
*H05K 7/10* (2006.01)

(52) U.S. Cl. .................. 361/777; 361/793; 361/794

(58) Field of Classification Search ......... 361/792–794; 349/149–152

See application file for complete search history.

(56) References Cited

U.S. PATENT DOCUMENTS

| 4,410,874 A | * | 10/1983 | Scapple et al. .............. 338/307 |
| 5,023,753 A | * | 6/1991 | Abe ........................... 361/782 |
| 6,097,612 A | * | 8/2000 | Ishikawa et al. ............ 361/794 |
| 6,147,876 A | * | 11/2000 | Yamaguchi et al. ......... 361/766 |
| 6,493,198 B1 | | 12/2002 | Arledge et al. |
| 6,556,515 B1 | * | 4/2003 | Sekiguchi ................... 368/242 |
| 6,888,860 B2 | * | 5/2005 | Shaw .......................... 372/36 |

FOREIGN PATENT DOCUMENTS

TW 578446 B 3/2004

* cited by examiner

*Primary Examiner*—Tuan T Dinh
(74) *Attorney, Agent, or Firm*—McKenna Long & Aldridge LLP

(57) ABSTRACT

An LCD capable of preventing and electrostatic discharge is provided. The LCD includes a liquid crystal panel for displaying an image, a PCB on which electronic devices are mounted to generate signals for driving the liquid crystal panel, and a protective pattern formed around an electronic device of the electronic devices, which is vulnerable to an electrostatic discharge.

10 Claims, 4 Drawing Sheets

PRINTED CIRCUIT BOARD AND LIQUID CRYSTAL DISPLAY DEVICE HAVING THE SAME

This application claims the benefit of Korean Patent Application No. 2004-30205, filed on Apr. 29, 2004, which is hereby incorporated by reference for all purposes as if fully set forth herein.

BACKGROUND OF THE INVENTION

The present invention relates to a liquid crystal display device, and more particularly, to a printed circuit board capable of preventing electrostatic discharge and a liquid crystal display device having the same.

DESCRIPTION OF THE RELATED ART

A cathode ray tube (CRT) is heavy and has a large volume. In order to solve these problems, a flat panel display device has been developed. Flat panel display devices include liquid crystal display devices (LCDs), field emission display devices (FEDs), plasma display panels (PDPs), electro-luminescence (EL) display devices, and the like.

Of these, the LCD has a number of advantages, such as small size, light weight and low power consumption. Accordingly, LCDs are replacing CRTs as display devices. LCDs are attached to all information processing apparatuses which require display devices.

In the LCD, a plurality of pixels are arranged in an active matrix form, and data voltages corresponding to image information are supplied to the pixels such that the optical transmittance of a liquid crystal layer is controlled. In this manner, desired images may be displayed. To achieve this, the LCD includes a system board, a gate printed circuit board (PCB), a data PCB, and a liquid crystal panel. The system board generates gate control signals and data control signals, depending on digital data signals provided from a computer system. The gate PCB generates scan signals in response to the gate control signals. The data PCB generates analog data voltages that are produced by gamma correcting the digital data signals in response to the data control signals. The liquid crystal panel displays images by applying the analog data voltages.

FIG. 1 illustrates a rear view of an LCD having a conventional PCB.

Referring to FIG. 1, an upper cover and a lower cover are attached to a main frame 1. A liquid crystal panel and a backlight assembly are sequentially attached on a front side of the main frame 1. A gate PCB 3 and a data PCB 2 are attached on a rear side of the main frame 1. Although not shown, tape carrier packages (TCPs) and data TCPs are electrically connected between the PCBs 2 and 3 and the liquid crystal panel. Gate drive ICs and data drive ICs are mounted on the gate TCPs and the data TCPs by a tap automated bonding (TAB) method. In addition to the gate PCB 3 and the data PCB 2, the system board is provided on the rear side of the main frame 1 and controls an overall operation of the LCD.

The gate control signal and the data control signal generated from the system board are provided to the gate PCB 3 and the data PCB 2, respectively. The gate PCB 3 sequentially supplies scan signals to gate lines of the liquid crystal panel in response to the gate control signals, such that the gate lines of the liquid crystal panel are sequentially activated. The data PCB 2 sequentially supplies data voltages to data lines of the liquid crystal panel in response to the data control signals. In this manner, images are displayed on the liquid crystal panel.

Although the gate PCB 3 and the data PCB 2 are divided in FIG. 1, the gate PCB 3 often integrated into the data PCB 2. Therefore, only one PCB may be attached on the main frame 1.

FIG. 2 illustrates an enlarged view of the PCB shown in FIG. 1. In FIG. 2, the PCB may be the gate PCB, the gate PCB, or a single PCB in which the gate PCB and the data PCB are integrated together.

Referring to FIG. 2, various electronic devices, such as a gamma voltage generator and a common voltage (Vcom) generator, are mounted on the PCB.

Referring to FIG. 3, a metal plate is coated on a substrate and etched to form signal patterns and ground patterns. Terminals of the packaged electronic devices 30 and 32 are soldered to the signal patterns.

In order to prevent the electronic devices 30 and 32 from being damaged by an electrostatic discharge applied from the exterior or generated from inside, the upper portions of the electronic devices 30 and 32 are wrapped with a cover shield. The cover shield is made of a polyresin-based insulating material. Accordingly, the electrostatic discharge is shielded by the cover shield, such that the damage of the electronic devices 30 and 32 can be prevented.

In order to vary the common voltage (Vcom), a variable resistor 30 may be further included in the common voltage generator. The variable resistor 30 can adjust picture quality by varying the common voltage, which is a reference voltage of the liquid crystal panel. Accordingly, the variable resistor 30 often needs to be adjusted from the exterior. In this case, a portion corresponding to the variable resistor 30 is cut away or removed from the wrapped cover shield. Therefore, when it is necessary to vary the variable resistor 30, the cut-away cover shield corresponding to the variable resistor 30 is opened and the variable resistor 30 is varied. Thereafter, the cut-away cover shield is again covered.

In FIG. 3, all of the electronic devices 32 mounted on the PCB can be wrapped by the cover shield.

Because the variable resistor 30 is not completely wrapped by the cut-away cover shield, the PCB may be damaged due to electrostatic discharge applied from the exterior or generated from the interior.

Because the electrostatic discharge flowing through the variable resistor 30 affects the electronic devices 32 mounted adjacent to the variable resistor 30, the electronic devices 32 may be damaged. In order to prevent damage to the electronic devices 32, the electronic devices 32 are mounted such that they are spaced far apart from the variable resistor 30. In this case, it is difficult to mount all the desired electronic devices in the limited space of the PCB. Even if the desired electronic devices are mounted on the PCB, signal a processing operation between the electronic devices is unstable.

In FIG. 3, a reference numeral "31" represents the signal patterns.

Although the variable resistor 30 is one example of the electronic device having the opened cover shield in FIG. 3, other electronic devices having the opened cover shield may be present as well. Accordingly, it should be noted that electronic devices having the opened cover shield other than the variable resistor 30 also have the above-described problems.

SUMMARY OF THE INVENTION

Accordingly, the present invention is directed to a PCB and an LCD having the same that substantially obviates one or more problems due to limitations and disadvantages of the related art.

An advantage of the present invention is to provide a PCB and an LCD having the same, in which protective patterns are formed around the externally exposed electronic devices such that an electrostatic discharge is prevented.

Another advantage of the present invention is to provide a PCB and an LCD device having the same, in which non-exposed electronic devices are mounted adjacent to the externally exposed electronic devices having protective patterns, such that the degree of integration of the electronic devices is improved.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, an LCD includes: a liquid crystal panel for displaying an image; a PCB on which electronic devices are mounted to generate signals for driving the liquid crystal panel; and a protective pattern formed around an electronic device which is vulnerable to an electrostatic discharge among the electronic devices.

In another aspect of the present invention, a PCB includes: a substrate; an electronic device mounted on the substrate and vulnerable to an electrostatic discharge; and a protective pattern formed around the electronic device.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

In the drawings.

DETAILED DESCRIPTION OF THE ILLUSTRATED EMBODIMENTS

Reference will now be made in detail to a number of embodiments of the present invention, examples of which are illustrated in the accompanying drawings. Wherever possible, the same reference numbers will be used throughout the drawings to refer to the same or like parts.

Figure 1:
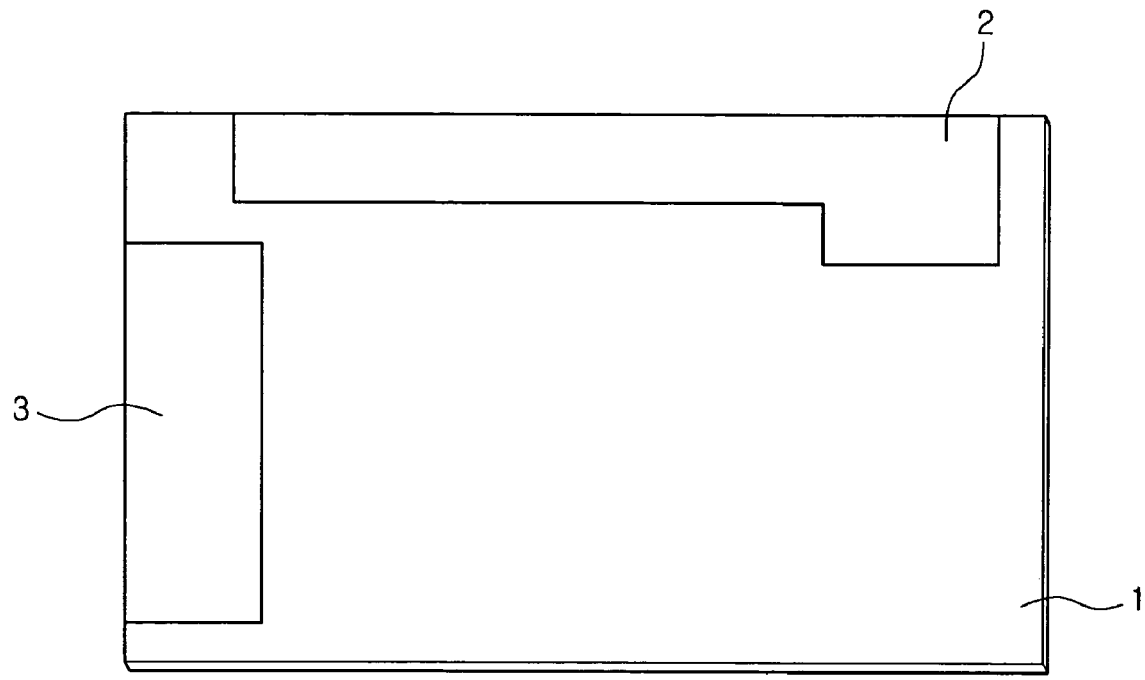
FIG. 1 is a rear view illustrating an LCD having a conventional PCB.
Figure 2:
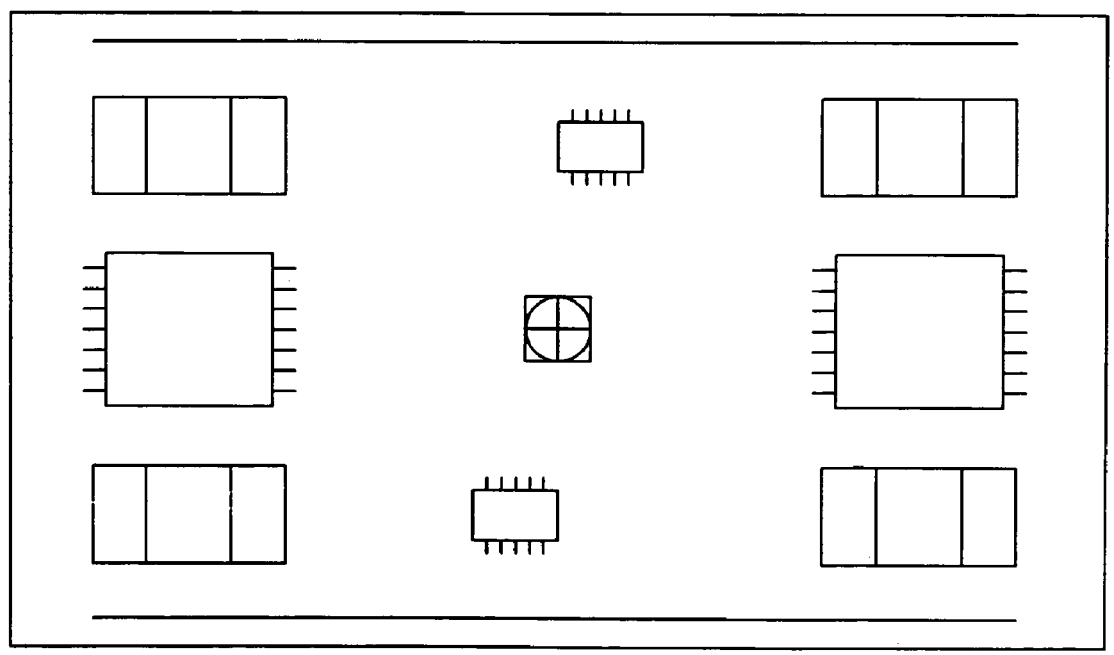
FIG. 2 is an enlarged view illustrating the PCB illustrated in FIG. 1.
Figure 3:
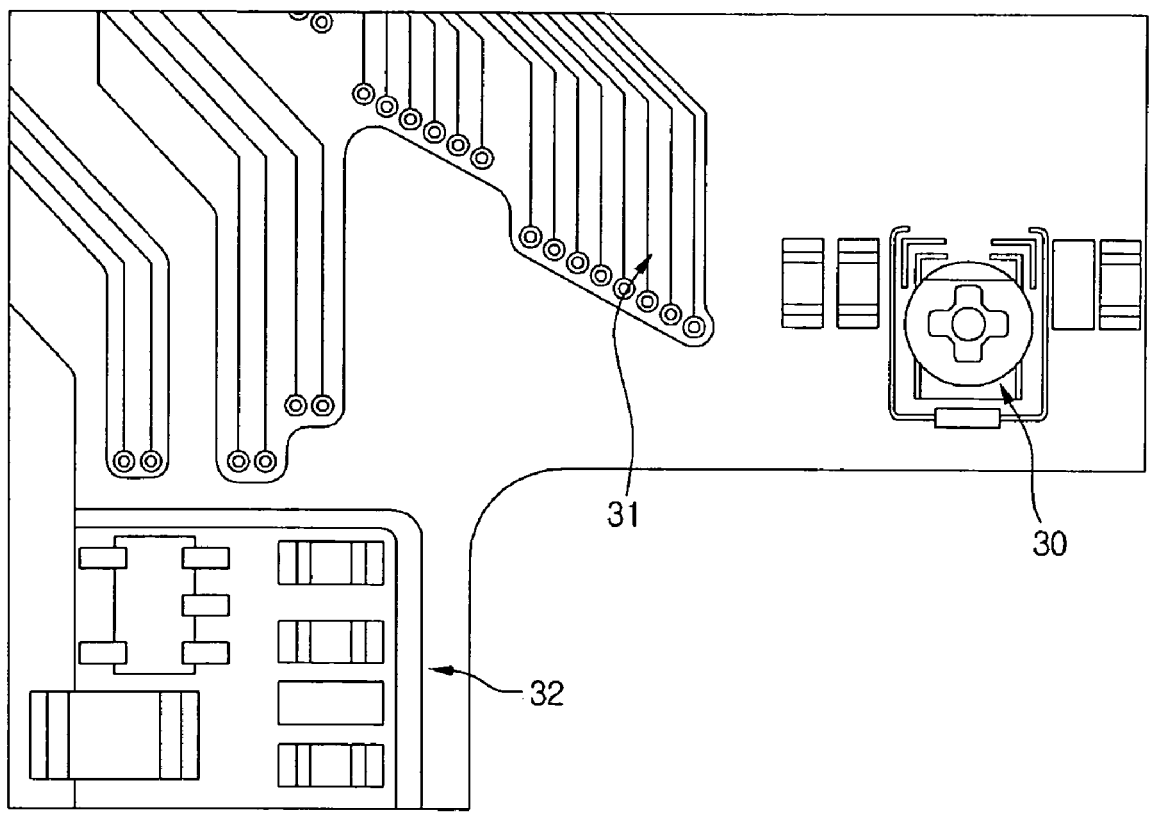
FIG. 3 is a plan view illustrating a PCB having a variable resistor mounted thereon, which may be damaged due to electrostatic discharge.
Figure 4:
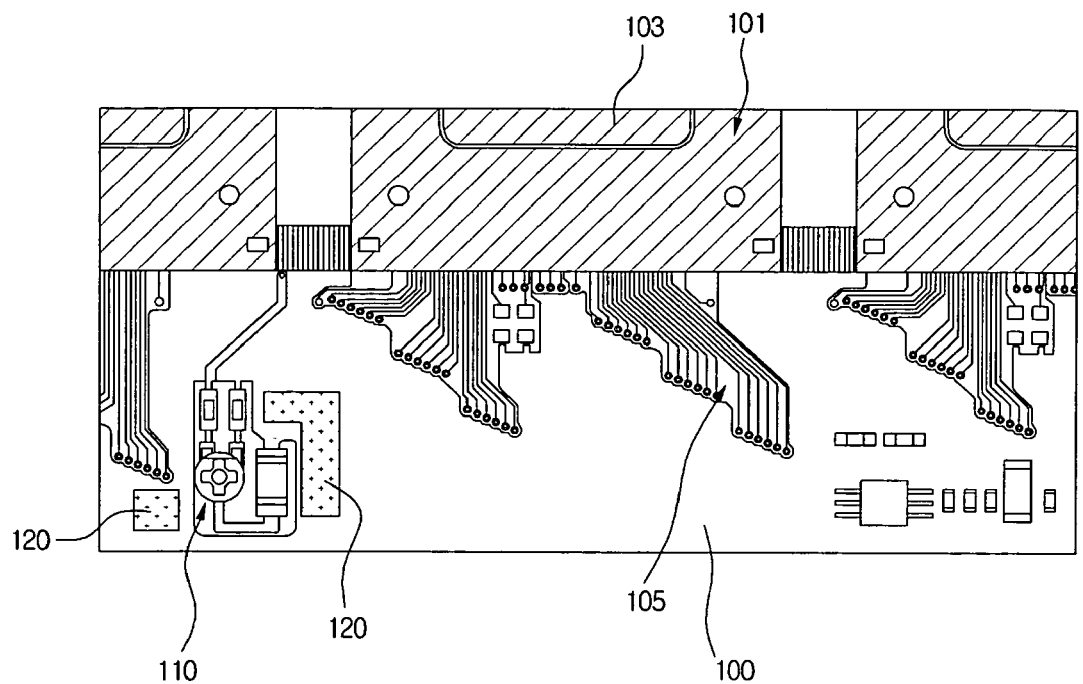
FIG. 4 is a plan view illustrating a PCB according to an embodiment of the present invention, which can prevent electrostatic discharge.

FIG. 4 is a plan view illustrating a PCB able to prevent electrostatic discharge according to a first embodiment of the present invention.

In this embodiment, the LCD includes a liquid crystal panel (not illustrated), a PCB 100 and a system board (not illustrated). The liquid crystal panel (not illustrated) displays images and the PCB 100 generates a signal for driving the liquid crystal panel. The drive signal includes a scan signal, a data voltage, a gamma voltage, and a common voltage. The system board generates a signal for controlling the PCB. Various electronic devices, such as a gamma voltage generator and a common voltage (Vcom) generator, are mounted on the PCB 100 in a package form.

Referring to FIG. 4, the TCPs 101 are electrically connected to the PCB 100. Signal patterns 105 are formed on the PCB 100 so as to transfer the signals to the TCPs 101.

A variable resistor 110 for varying the common voltage (Vcom) is mounted on the PCB 100.

The variable resistor 110 often needs to be adjusted from the exterior. In this case, a portion, such as a left portion, a right portion or a lower portion, for example, corresponding to the variable resistor 110 is cut away or removed from a cover shield wrapped thereon. Because of this, the variable resistor 110 is exposed to the exterior and is vulnerable to damage from electrostatic discharge.

In order to prevent the electrostatic discharge, protective patterns 120 are formed around the variable resistor 110. The protective patterns 120 may be formed by exposing ground patterns of the PCB 100 to the exterior. Any electrostatic discharge applied from the exterior or generated from the interior is guided to the ground patterns through the protective patterns 120, so the variable resistor 110 may be protected from electrostatic discharge. After forming the ground patterns, a solder resistor is coated to insulate the ground patterns from the exterior. In this case, the protective patterns 120 are formed by removing the solder resistor coated around the variable resistor 110. Accordingly, the protective patterns 120 are the externally exposed ground patterns. The electrostatic discharge is shielded by the protective patterns, such that the variable resistor 110 is not damaged.

In FIG. 4, a reference numeral "103" represents a drive IC.

Although the variable resistor 30, which in this example is the electronic device exposed through the opened cover shield and illustrated in FIG. 4, there may be electronic devices other than the variable resistor 30 that are exposed to the exterior of the device. Accordingly, the present invention is applicable to any electronic devices having an opened cover shield in addition to the variable resistor 110. That is, the corresponding electronic devices can be protected from the electrostatic discharge by forming the protective patterns 120 in which the ground patterns around the electronic devices having the opened cover shield are exposed.

Figure 5:
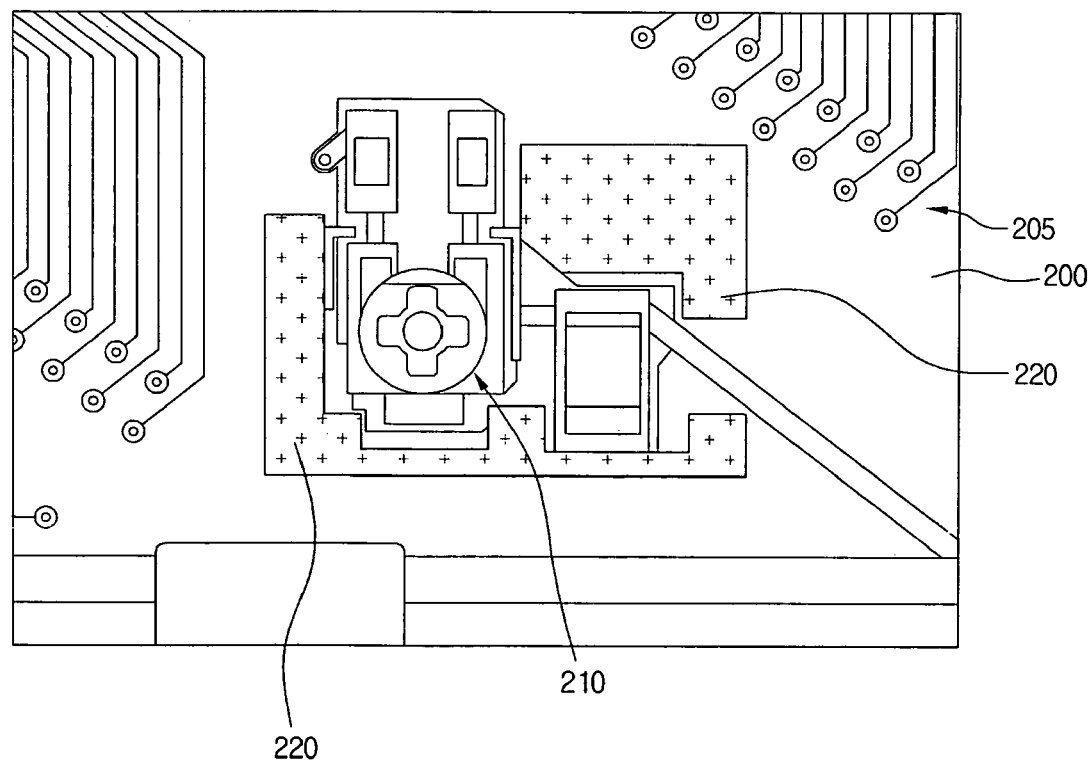
FIG. 5 is a plan view illustrating a PCB according to another embodiment of the present invention, which can prevent electrostatic discharge.

FIG. 5 is a plan view illustrating a PCB according to another embodiment of the present invention, which can prevent electrostatic discharge. In FIG. 4, the description has been limited to the PCB 100 that is installed in the LCD to protect the exposed variable resistor 110. In FIG. 5, however, a PCB 200 installed in other electronic equipments as well as the LCD is illustrated. Even when the electronic device 210 mounted on the PCB 200 is insulated by a cover shield, it may be damaged. That is, even when the electronic devices 210 are covered with the cover shield, fine holes are formed at the cover shield. Thus, the electronic devices may be damaged due to the electrostatic discharge introduced through the fine holes.

Referring to FIG. 5, an electronic device 210 vulnerable to the electrostatic discharge may be installed on the PCB 200, which is mounted on general electronic equipments. The electronic device 210 may be an externally exposed variable resistor, for example.

In this example, protective patterns 220 can be formed by removing a solder resistor around the electronic device 210. The protective patterns 220 may be ground patterns that are exposed by removing the solder resistor formed on the ground patterns.

Accordingly, the electrostatic discharge applied from the exterior or generated from the interior is guided to the ground patterns through the protective patterns 220, thereby protecting the electronic device 210 from the electrostatic discharge. Thus, the present invention can protect the electronic device 210 from the electrostatic discharge on the PCB applied to other electronic equipments as well as the LCD.

In this way, it is possible to prevent the electronic device 210 from being damaged due to the electrostatic discharge by forming the protective patterns 220 around the electronic device 210. Even if other electronic devices are formed adjacent to the electronic device that is vulnerable to the electrostatic discharge, the electrostatic discharge is shielded by the protective patterns 220. Thus, other electronic devices can be protected from the electrostatic discharge as well. Because many more electronic devices may be mounted on the limited PCB, the space efficiency of the PCB is maximized.

In FIG. 5, the reference numeral "205" represents signal patterns.

Figure 6:
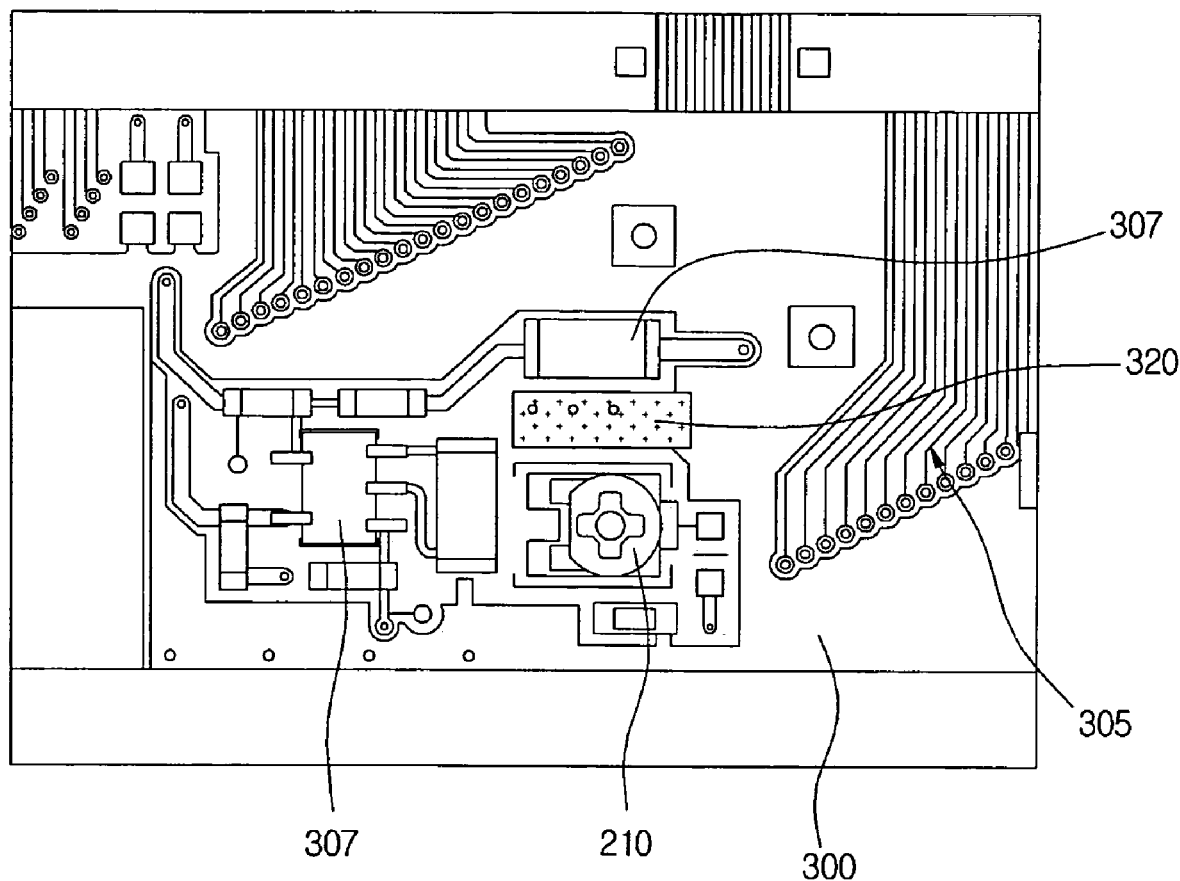
FIG. 6 is a plan view illustrating a PCB according to a further another embodiment of the present invention, which can prevent electrostatic discharge.

FIG. 6 is a plan view illustrating a PCB which can prevent electrostatic discharge according to another embodiment of the present invention. A PCB 300 illustrated in FIG. 6 may be applied to an LCD device. In FIG. 6, the PCB 300 includes an externally exposed variable resistor 210 and a plurality of non-exposed electronic devices 307 mounted adjacent to the variable resistor 210. Because the variable resistor 210 is exposed to the exterior, it may be easily damaged by electrostatic discharge. Also, the non-exposed electronic devices 307 mounted adjacent to the variable resistor 210 may be easily damaged.

In this exemplary embodiment, protective patterns 320 are formed around the externally exposed variable resistor 210 so as to protect the devices from the electrostatic discharge, as illustrated in FIG. 6. Specifically, the protective patterns 320 may be formed between the variable resistor 210 and the non-exposed electronic device 307. By doing so, the electrostatic discharge can be shielded by the protective patterns 320, thereby preventing the damage of the non-exposed electronic device 307 as well as the variable resistor 210.

A variety of non-exposed electronic devices 307 may be mounted adjacent to the variable resistor 210 on the PCB 300 regardless of the electrostatic discharge, such that the space efficiency of the PCB is maximized.

According to the present invention, the protective patterns are formed without any apparatus (e.g., an electrostatic preventing pattern) for preventing the electrostatic discharge, such that electronic devices mounted on the PCB may be protected from the electrostatic discharge.

In addition, the present invention may be applied to other electronic devices as well as LCD devices by forming the protective patterns around the electronic device that is vulnerable to electrostatic discharge. Therefore, the application of the PCB capable of shielding the electrostatic discharge can be extended beyond LCD devices.

Furthermore, the space efficiency of the PCB can be maximized by forming the protective patterns around the electronic device vulnerable to the electrostatic discharge and mounting other electronic devices on positions adjacent to the electronic device.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A liquid crystal display device (LCD) comprising:
    a liquid crystal panel for displaying an image;
    a printed circuit board (PCB) including a ground pattern and a solder resistor formed thereon and having electronic devices mounted thereon to generate signals for driving the liquid crystal panel; and
    protective patterns formed around an electronic device which is vulnerable to an electrostatic discharge separating the vulnerable electronic device from other electronic devices, wherein the protective patterns have a plurality of patterns formed by the ground pattern exposed to the exterior by partially removing the solder resistor around the vulnerable electronic device.

2. The LCD according to claim 1, wherein the electronic device vulnerable to the electrostatic discharge is a variable resistor.

3. The LCD according to claim 1, further comprising a plurality of signal patterns formed on the PCB.

4. The LCD according to claim 1, wherein other electronic devices are adjacent to the electronic device vulnerable to the electrostatic discharge having the protective patterns interposed therebetween.

5. The LCD according to claim 3, wherein the protective patterns guides the electrostatic discharge to the ground pattern.

6. A printed circuit board (PCB) comprising:
    a substrate including a ground pattern and a solder resistor formed thereon;
    an electronic device mounted on the substrate and vulnerable to an electrostatic discharge;
    other electronic devices mounted on the substrate; and
    protective patterns formed around the electronic device which is vulnerable to an electrostatic discharge separating the vulnerable electronic device from the other electronic devices,
    wherein the protective patterns have a plurality of patterns formed by the ground pattern exposed to the exterior by partially removing the solder resistor around the vulnerable electronic device.

7. The PCB according to claim 6, wherein the electronic device vulnerable to the electrostatic discharge is a variable resistor.

8. The PCB according to claim 6, further comprising a plurality of signal patterns formed on the PCB.

9. The PCB according to claim 6, wherein other electronic devices are formed adjacent to the electronic device vulnerable to the electrostatic discharge, with the protective patterns interposed therebetween.

10. The PCB according to claim 8, wherein the protective patterns guides the electrostatic discharge to the ground pattern.

* * * * *